United States Patent
Tanaka et al.

(10) Patent No.: US 8,241,436 B2
(45) Date of Patent: Aug. 14, 2012

(54) CONDUCTIVE FILLER AND SOLDER MATERIAL

(75) Inventors: Norihito Tanaka, Tokyo (JP); Yasuki Shimamura, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 68 days.

(21) Appl. No.: 11/887,181

(22) PCT Filed: Mar. 29, 2006

(86) PCT No.: PCT/JP2006/306490
§ 371 (c)(1),
(2), (4) Date: Sep. 26, 2007

(87) PCT Pub. No.: WO2006/109573
PCT Pub. Date: Oct. 19, 2006

(65) Prior Publication Data
US 2009/0139608 A1    Jun. 4, 2009

(30) Foreign Application Priority Data
Apr. 1, 2005  (JP) .................................. 2005-106880

(51) Int. Cl.
*B23K 35/34* (2006.01)
*H01B 1/02* (2006.01)
(52) U.S. Cl. .............................. 148/24; 252/512; 75/255
(58) Field of Classification Search .................... 148/24; 75/255; 252/512
See application file for complete search history.

(56) References Cited

U.S. PATENT DOCUMENTS

| 2002/0114726 A1 | 8/2002 | Soga et al. |
| 2003/0224197 A1 | 12/2003 | Soga et al. |
| 2004/0079194 A1* | 4/2004 | Nakata et al. ................... 75/255 |

FOREIGN PATENT DOCUMENTS

JP    5-50286    3/1993

(Continued)

OTHER PUBLICATIONS

European Search Report for Application No. EP 06730438.6 dated May 29, 2009.

(Continued)

*Primary Examiner* — Emily Le
*Assistant Examiner* — Rebecca Lee
(74) *Attorney, Agent, or Firm* — Finnegan, Henderson, Farabow, Garrett & Dunner, L.L.P.

(57) ABSTRACT

There is provided a conductive filler with high heat resistance which can be melt-bonded under reflow heat treatment conditions for a lead-free solder and, after the bonding, does not melt under the same heat treatment conditions. The conductive filler is characterized in that, as measured by differential scanning calorimetry, it has at least one metastable metal alloy phase observed as an exothermic peak and has at least one melting point observed as an endothermic peak in each of the 210 to 240° C. range and the 300 to 450° C. range, and that the filler, upon heat treatment at 246° C., gives a bonded object which has, as measured by differential scanning calorimetry, no melting point observed as an endothermic peak in the 210 to 240° C. range or has a melting endotherm calculated from an endothermic peak area in the 210 to 240° C. range, the melting endotherm being 90% or less of the melting endotherm of the filler before bonding calculated from an endothermic peak area in the 210 to 240° C. range.

2 Claims, 10 Drawing Sheets

FOREIGN PATENT DOCUMENTS

| | | |
|---|---|---|
| JP | 5-228685 | 9/1993 |
| JP | 11-151591 | 6/1999 |
| JP | 2002-254194 | 9/2002 |
| JP | 2003-311469 | 11/2003 |
| JP | 2004-167569 | 6/2004 |
| JP | 2004-223559 | 8/2004 |
| JP | 2004-363052 | 12/2004 |
| JP | 2005-5054 | 1/2005 |
| WO | WO 02/28574 A1 | 4/2002 |

* cited by examiner

[Figure 1]
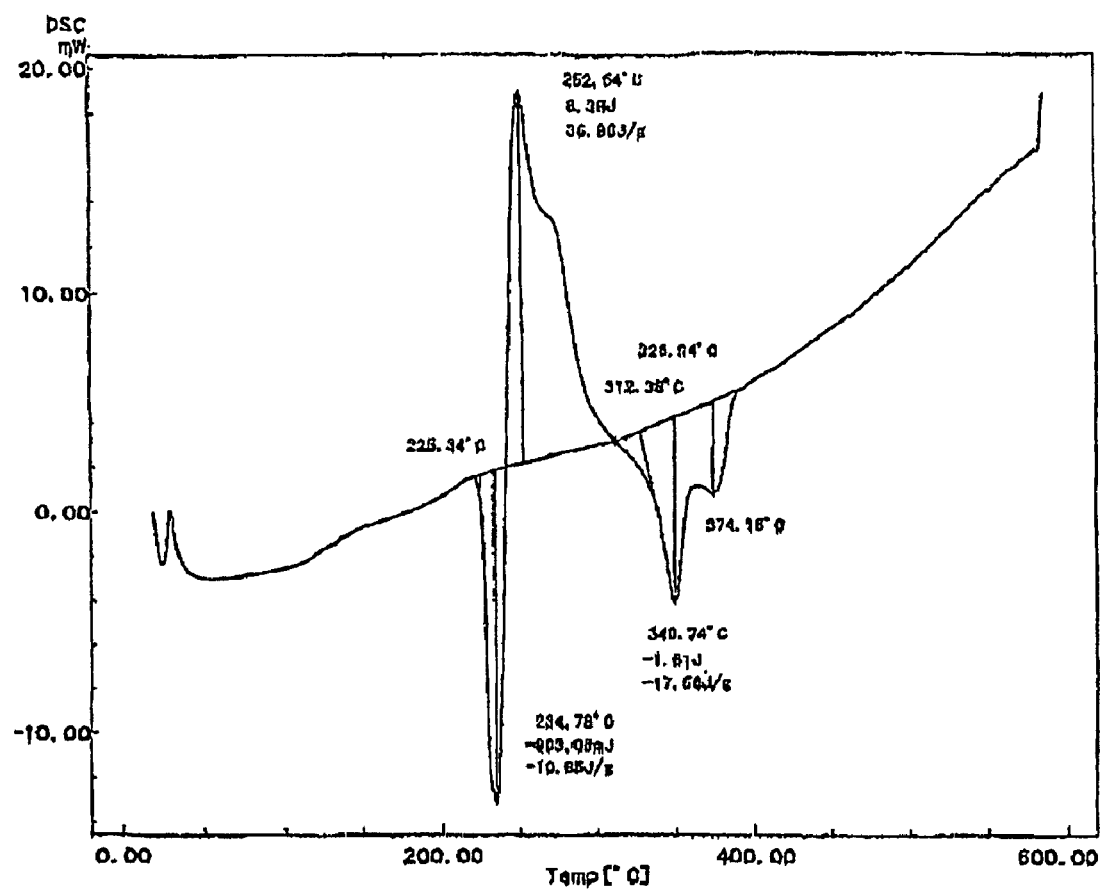

[Figure 2]
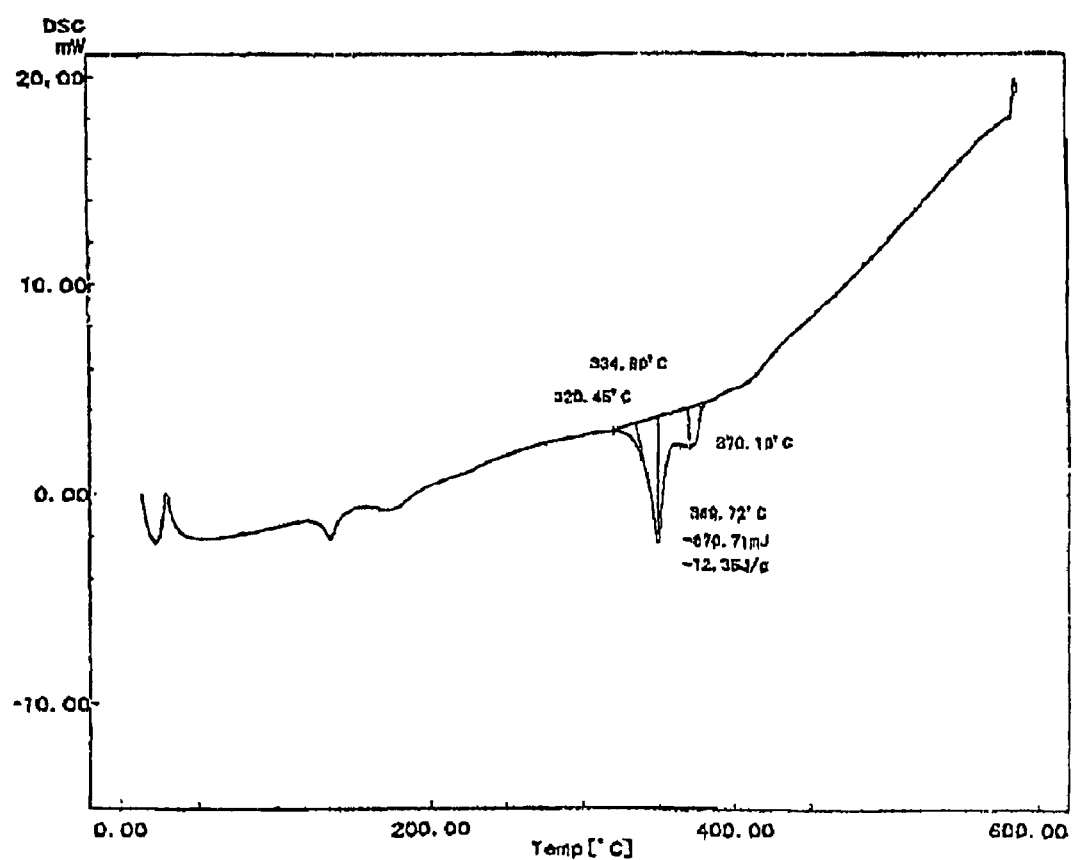

[Figure 3]
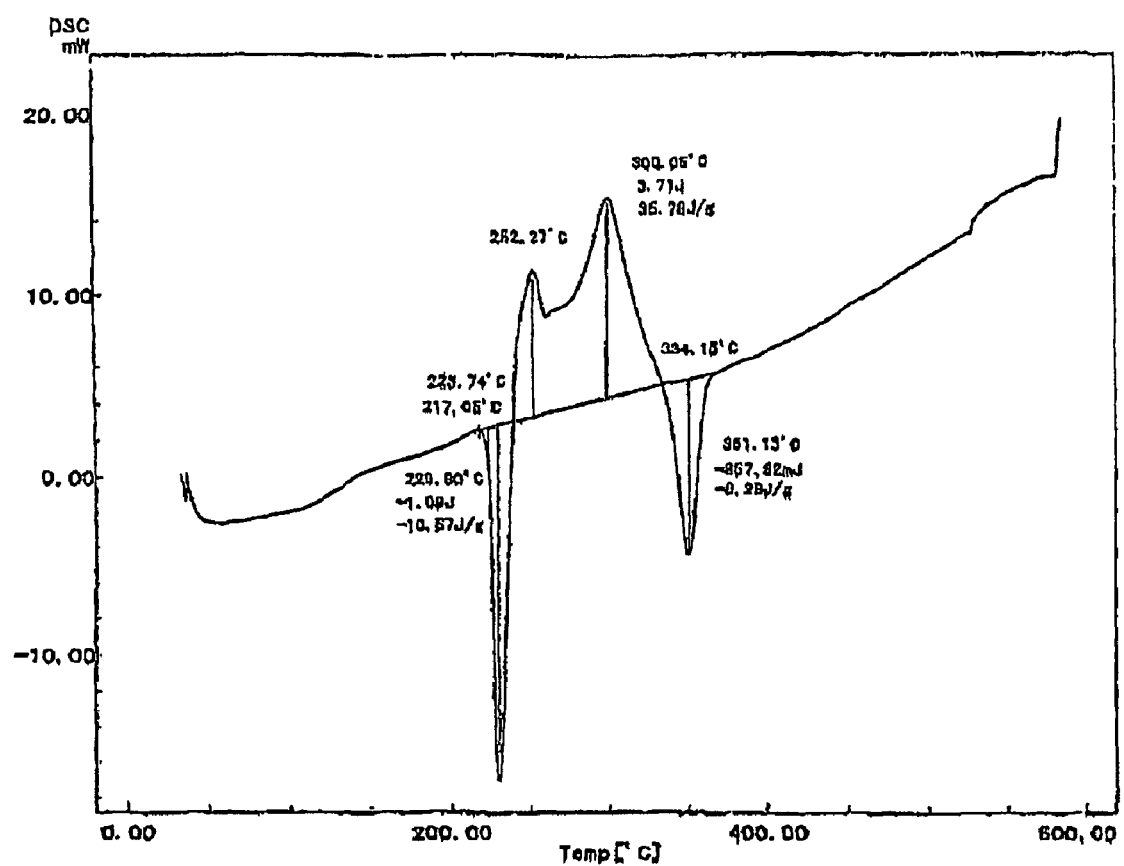

[Figure 4]
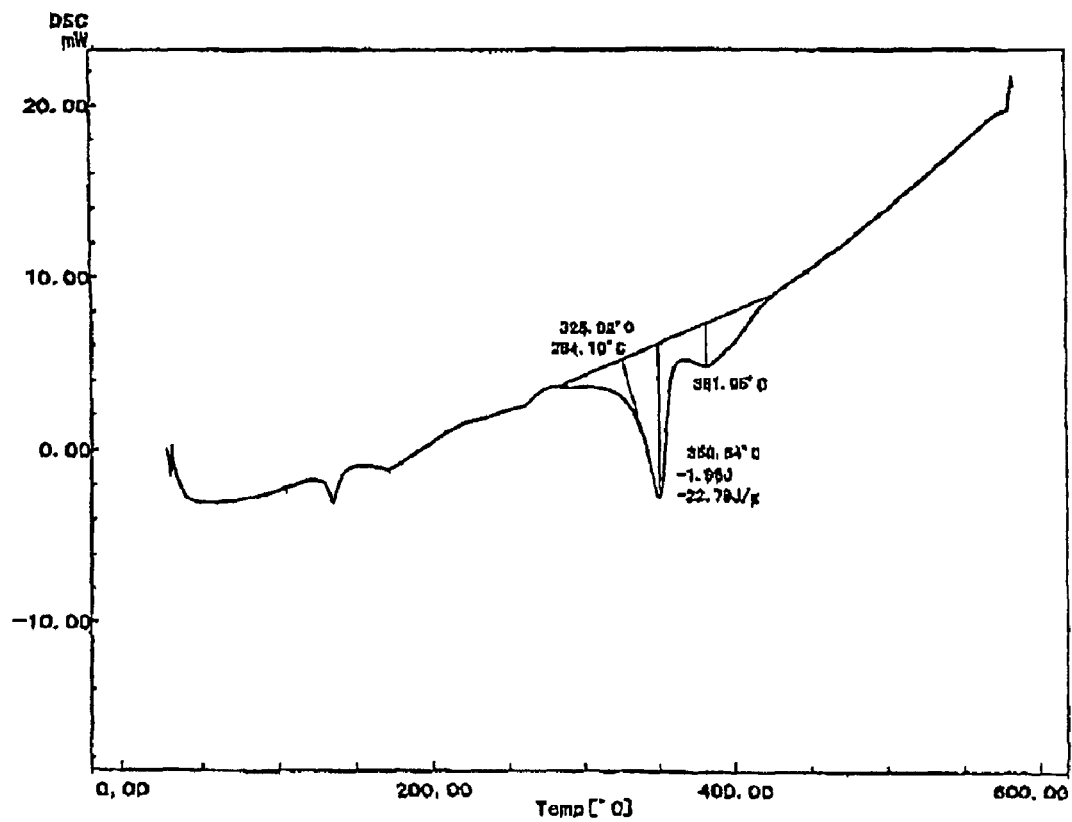

[Figure 5]
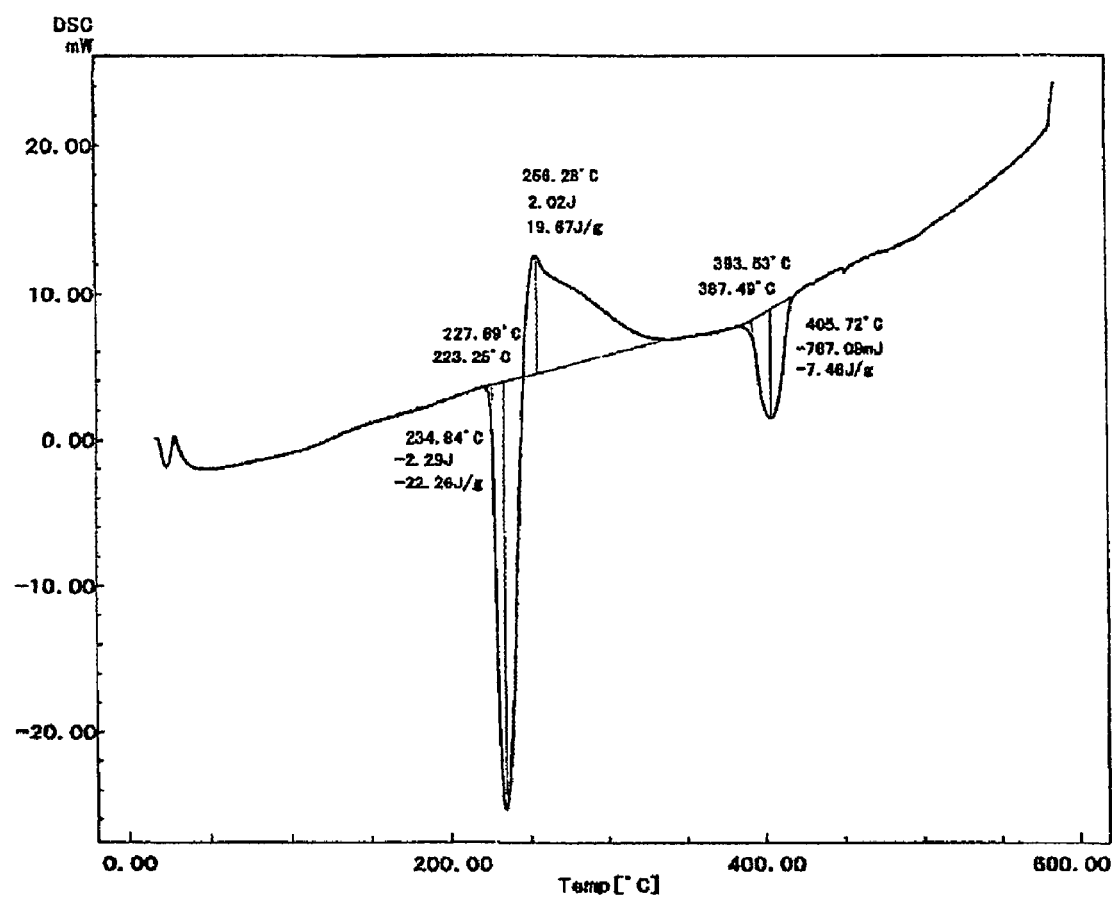

[Figure 6]
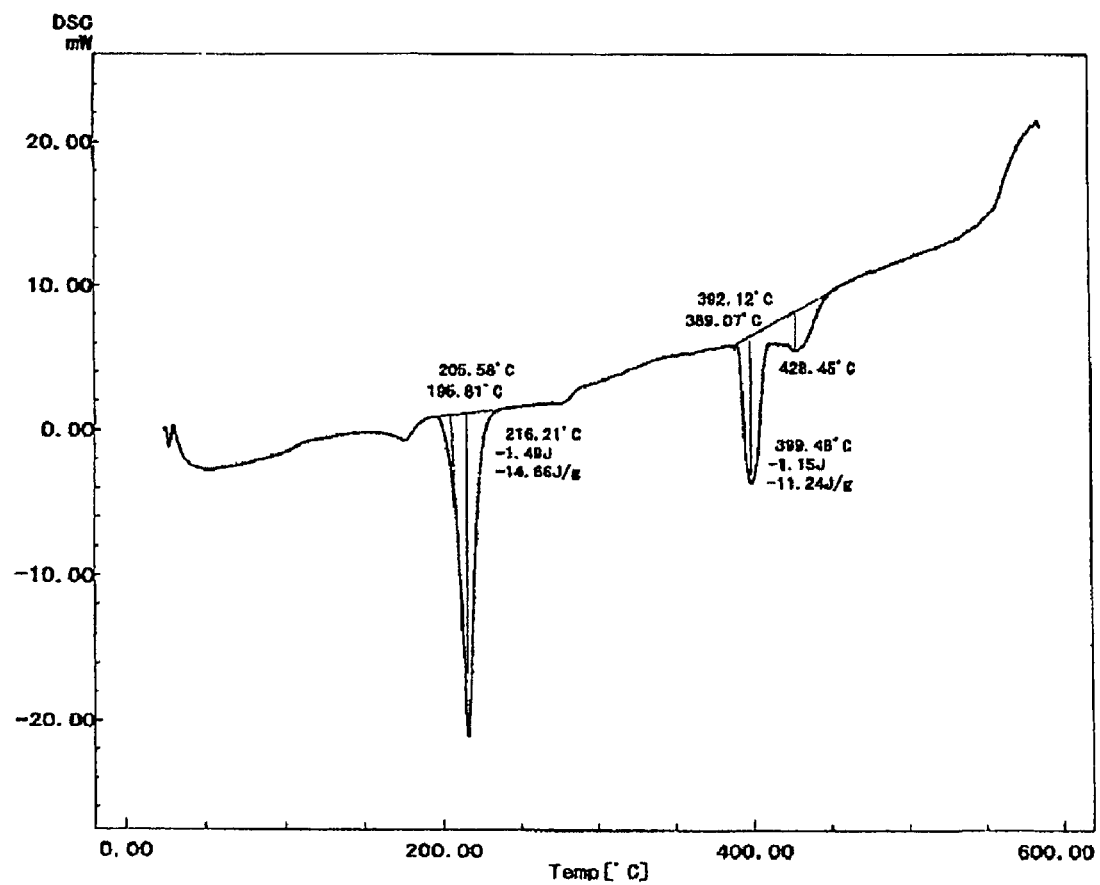

[Figure 7]
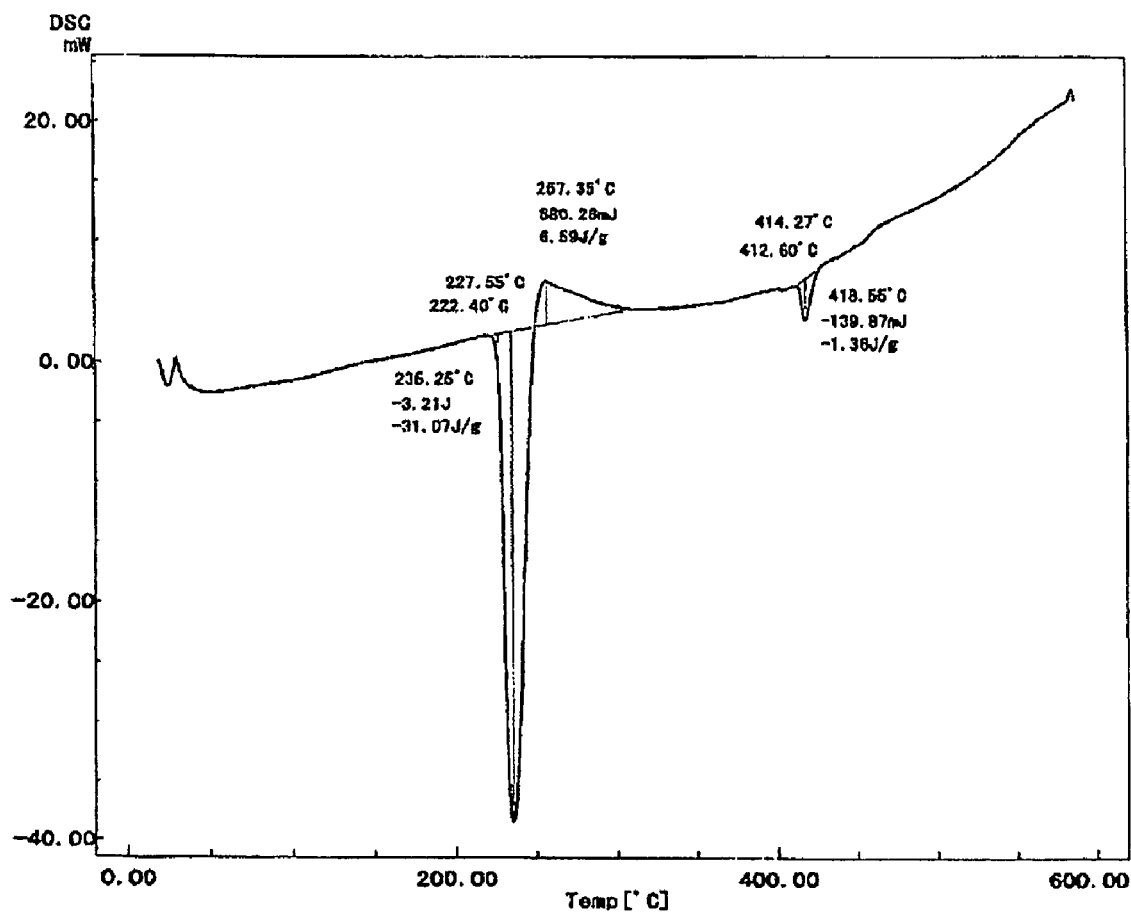

[Figure 8]
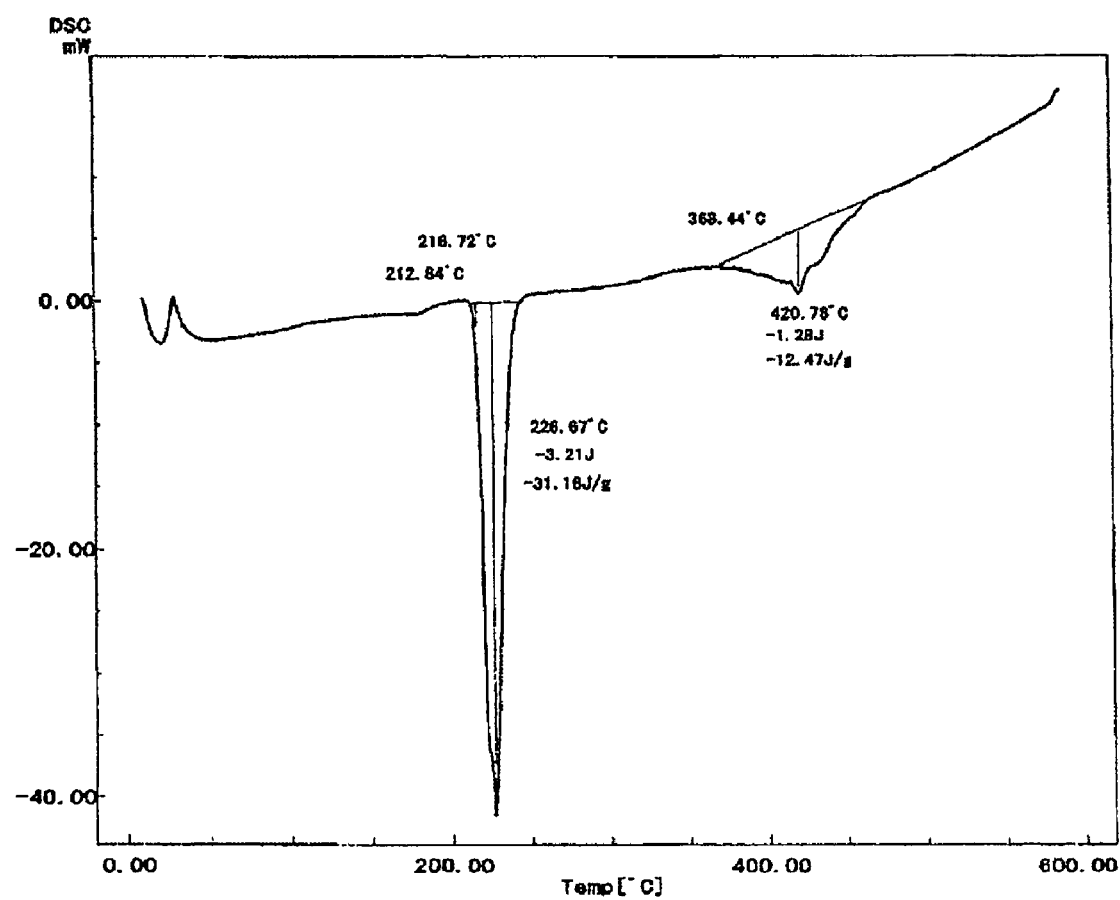

[Figure 9]
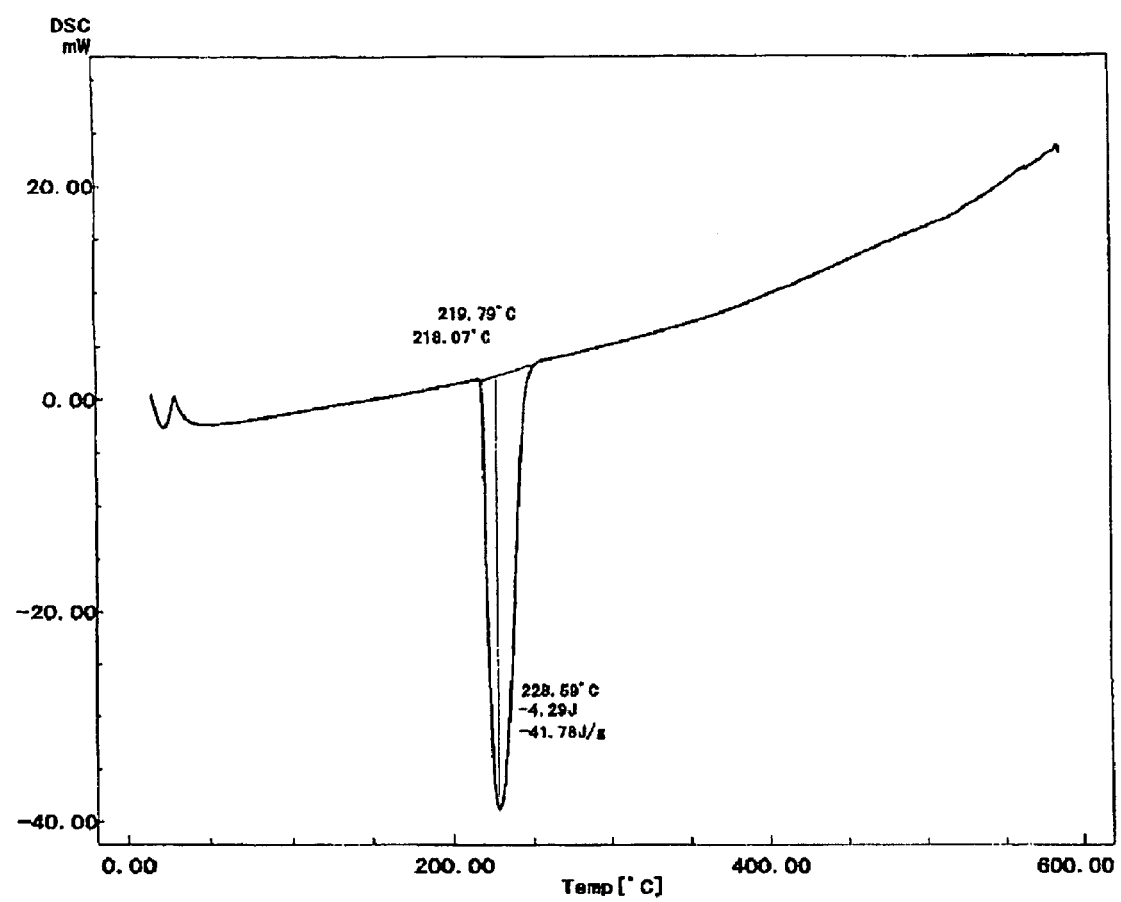

[Figure 10]
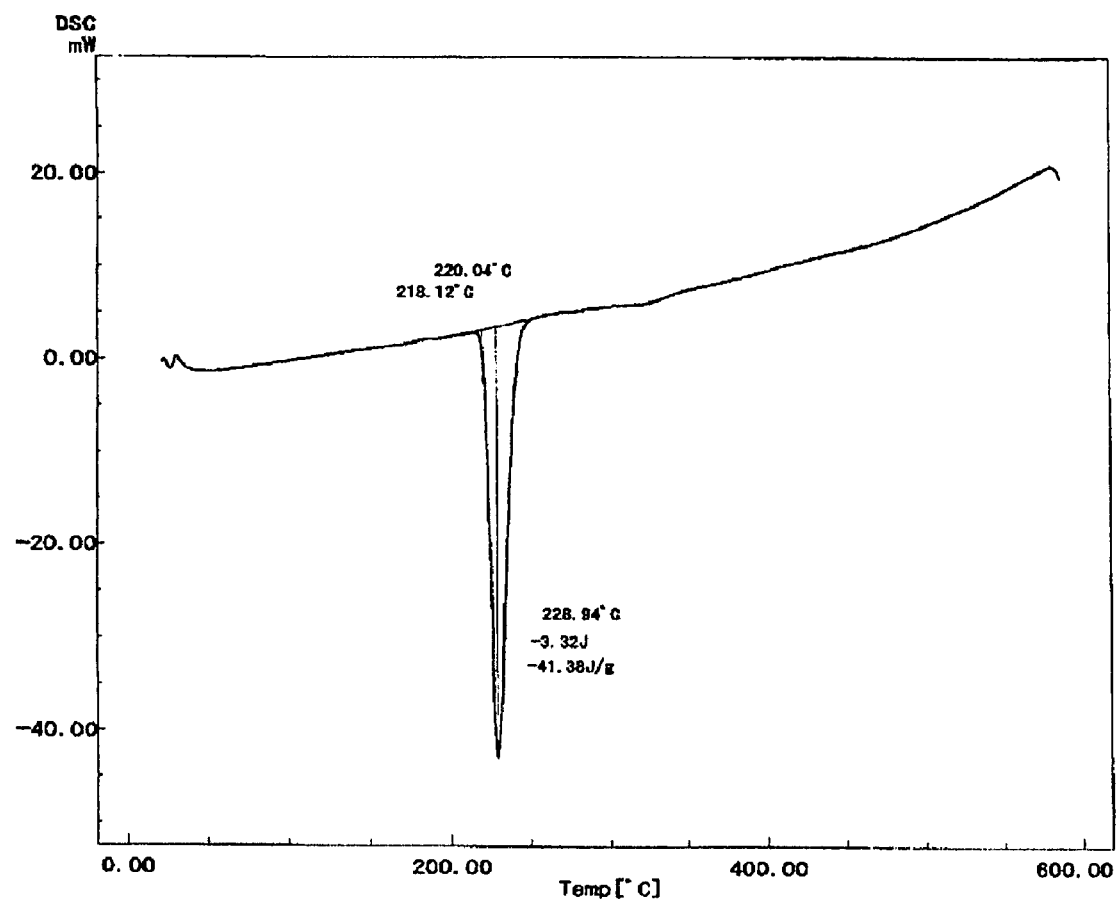

CONDUCTIVE FILLER AND SOLDER MATERIAL

TECHNICAL FIELD

The present invention relates to a conductive filler used as a bonding material for electric and electronic equipment, particularly to a lead-free solder material and a conductive adhesive.

BACKGROUND ART

Solder is generally used for bonding metal materials and is composed of a metal alloy material having a melting temperature range (a range from the solidus temperature to the liquidus temperature) of 450° C. or less. A Sn-37Pb eutectic solder having a melting point of 183° C. has heretofore been generally used as a solder material used in reflow heat treatment. Further, a Sn-90Pb high temperature solder having a solidus temperature of 270° C. and a liquidus temperature of 305° C. has been extensively used as a high temperature solder used in the interior of electronic parts and the like where high heat resistance is required.

However, in recent years, the harmfulness of lead is becoming a problem as described in the EU's environmental regulations (WEEE and RoHS directives), and the percentage of a lead-free solder in the total solder is rapidly increasing from the viewpoint of preventing environmental pollution. At present, in such a situation, there is proposed a lead-free solder (refer to Patent Documents 1 and 2) comprising Sn-3.0Ag-0.5Cu having a melting point of about 220° C. as an alternative to the Sn-37Pb eutectic solder, and reflow heat treatment in the range of about 240 to 260° C. is coming into common use. In general, conditions of reflow heat treatment are set in a temperature range higher by 10 to 50° C. than the melting point of solder metal alloy.

On the other hand, an Au-20Sn eutectic metal alloy (melting point: 280° C.), a Sb—Sn based metal alloy (refer to Patent Document 3) and the like are proposed as a high temperature solder material. However, the Au—Sn based metal alloy is limited in use because it is a material which is mechanically hard and brittle and thereby has poor stress relaxation characteristics, and it is also an extremely expensive material. Further, the Sb—Sn based metal alloy is pointed out that it has a harmfulness of Antimony. Thus, there is no strong alternative material for a high temperature solder material. As a result, in the above-mentioned RoHS derivatives to be executed from July, 2006, a high temperature solder containing 85% or more of lead is granted a waiver until an alternative material is established.

The inventors have proposed a lead-free connection material simultaneously satisfying reliability with respect to heat resistance (even when the connection material is repeatedly subjected to heat treatment for mounting electronic parts and the like, the connection material is capable of preventing displacement of the electronic part which has already been mounted on the substrate), connection stability (capable of maintaining the stand-off between the electronic part and the substrate), and capability of attaching an electronic part or the like to a substrate by heat treatment at about 250° C. or less (refer to Patent Document 4). The connection material was composed of metal alloy particles having a two-layered structure, wherein the surface of the metal alloy particles had a composition different from the interior thereof, and the connection material had a feature that when it is used for connection, only the surface melts while the interior does not melt to thereby develop connection stability, and after connection the lowest melting point increases to thereby develop reliability with respect to heat resistance. As a specific preferred embodiment, there have been proposed metal alloy particles in which the metal alloy has a metastable phase composed of copper, tin, silver, bismuth, and indium and is coated with tin on the surface thereof by displacement plating.

Further, the inventors have proposed, as a lead-free connection material having the same object, a lead-free connection material comprising a composition of first metal alloy particles and second metal alloy particles, wherein the first metal alloy particles are obtained by subjecting the surface of the above-mentioned metal alloy having a metastable phase to displacement plating of tin and the second particles contain tin and indium and have a lowest melting point of from 50 to 150° C. (refer to Patent Documents 5, 6 and 7).

The solder material using the metal alloy particles as mentioned above can not only be used as a lead-free material but also satisfy a requirement as a high temperature solder material to a certain extent because the lowest melting point increases after the solder material is melted once and cured. However, in order to produce the metal alloy particles, a process to form a low melting point layer, for example, a tin displacement plating layer on the surface thereof is required, and the process had a problem of low productivity. In addition, since the displacement plating process proceeds by replacing copper on the surface with tin, it was technically difficult to increase the thickness of the displacement plating layer for further improving the connection strength.

Further, when a connection material comprising a composition containing metal alloy particles having a lowest melting point of from 50 to 150° C. such as the above-mentioned second metal alloy particles is heated to 240 to 260° C. at the mounting, the growth of the crystal grains of the metal alloy structure may proceed to thereby reduce the bonding strength due to the internal stress thereof. Therefore, it is not preferred that the difference between the lowest melting point and the mounting temperature is large.

[Patent Document 1]: Unexamined Japanese Patent Application Laid-Open Specification No. Hei 5-050286
[Patent Document 2]: Unexamined Japanese Patent Application Laid-Open Specification No. Hei 5-228685
[Patent Document 3]: Unexamined Japanese Patent Application Laid-Open Specification No. Hei 11-151591
[Patent Document 4]: WO 2002/028574
[Patent Document 5]: Unexamined Japanese Patent Application Laid-Open Specification No. 2004-223559
[Patent Document 6]: Unexamined Japanese Patent Application Laid-Open Specification No. 2004-363052
[Patent Document 7]: Unexamined Japanese Patent Application Laid-Open Specification No. 2005-5054

DISCLOSURE OF THE INVENTION

It is an object of the present invention to provide a conductive filler with high heat resistance which can be melt-bonded under reflow heat treatment conditions for a lead-free solder, for example, at a peak temperature of 246° C., and, after the bonding, does not melt under the same heat treatment conditions. It is another object of the present invention to provide a soldering paste which can not only be utilized as a lead-free solder material but also be used at temperatures lower than the temperature range for a conventional high temperature solder.

As a result of investigations to solve the above-mentioned problems by the inventors, the present invention has been achieved.

Therefore, a first aspect of the present invention is a conductive filler comprising a mixture of first metal particles and second metal particles, characterized in that, as measured by differential scanning calorimetry, the mixture has at least one metastable metal alloy phase observed as an exothermic peak, and has at least one melting point observed as an endothermic peak in each of the 210 to 240° C. range and the 300 to 450° C. range, but has no melting point observed as an endothermic peak in the 50 to 209° C. range, and that a bonded object obtained by subjecting the mixture to heat treatment at 246° C. to melt the second metal particles so as to be bonded to the first metal particles has, as measured by differential scanning calorimetry, no melting point observed as an endothermic peak in the 210 to 240° C. range or has a melting endotherm calculated from an endothermic peak area in the 210 to 240° C. range, the melting endotherm being 90% or less of the melting endotherm of the mixture calculated from an endothermic peak area in the 210 to 240° C. range.

It is preferred that the above-mentioned mixture comprises 100 parts by mass of the first metal particles and 50 to 200 parts by mass of the second metal particles, wherein the first metal particles comprise a metal alloy having a composition of 50 to 80% by mass of Cu and 20 to 50% by mass of at least one or more elements selected from the group consisting of Ag, Bi, In, and Sn, and the second metal particles comprise a metal alloy having a composition of 70 to 100% by mass of Sn.

A second aspect of the present invention is a soldering paste comprising the above-mentioned conductive filler.

The conductive filler of the present invention can be melt-bonded under reflow heat treatment conditions for a lead-free solder, for example, at a peak temperature of 246° C., and, after the bonding, exhibits high temperature resistance such that it does not melt under the same heat treatment conditions. The soldering paste of the present invention can not only be utilized as a lead-free solder material but also be used at temperatures lower than the temperature range for a conventional high temperature solder.

BRIEF DESCRIPTION OF THE DRAWINGS

FIG. 1 is a DSC chart obtained by subjecting a sample to differential scanning calorimetry, the sample comprising a conductive filler prepared in Example 1 by mixing first metal particles and second metal particles in a weight ratio of 100:83;

FIG. 2 is a DSC chart obtained by subjecting a sample to differential scanning calorimetry, the sample comprising a soldering paste obtained by subjecting a soldering paste prepared in Example 1 to reflow heat treatment at a peak temperature of 246° C. in a nitrogen atmosphere;

FIG. 3 is a DSC chart obtained by subjecting a sample to differential scanning calorimetry, the sample comprising a conductive filler prepared in Example 3 by mixing first metal particles and second metal particles in a weight ratio of 100:55;

FIG. 4 is a DSC chart obtained by subjecting a sample to differential scanning calorimetry, the sample comprising a soldering paste obtained by subjecting a soldering paste prepared in Example 3 to reflow heat treatment at a peak temperature of 246° C. in a nitrogen atmosphere;

FIG. 5 is a DSC chart obtained by subjecting a sample to differential scanning calorimetry, the sample comprising a conductive filler prepared in Example 5 by mixing first metal particles and second metal particles in a weight ratio of 100:186;

FIG. 6 is a DSC chart obtained by subjecting a sample to differential scanning calorimetry, the sample comprising a soldering paste obtained by subjecting a soldering paste prepared in Example 5 to reflow heat treatment at a peak temperature of 246° C. in a nitrogen atmosphere;

FIG. 7 is a DSC chart obtained by subjecting a sample to differential scanning calorimetry, the sample comprising a conductive filler prepared in Comparative Example 1 by mixing first metal particles and second metal particles in a weight ratio of 100:567;

FIG. 8 is a DSC chart obtained by subjecting a sample to differential scanning calorimetry, the sample comprising a soldering paste obtained by subjecting a soldering paste prepared in Comparative Example 1 to reflow heat treatment at a peak temperature of 246° C. in a nitrogen atmosphere;

FIG. 9 is a DSC chart obtained by subjecting a sample to differential scanning calorimetry, the sample comprising Sn-3.0Ag-0.5Cu lead-free solder particles in Comparative Example 3; and FIG. 10 is a DSC chart obtained by subjecting a sample to differential scanning calorimetry, the sample comprising a soldering paste obtained by subjecting a soldering paste prepared in Comparative Example 3 to reflow heat treatment at a peak temperature of 246° C. in a nitrogen atmosphere.

BEST MODE FOR CARRYING OUT THE INVENTION

The conductive filler of the present invention comprises a mixture of first metal particles and second metal particles characterized in that the mixture, in differential scanning calorimetry (hereinafter also referred to as "DSC"), has at least one metastable metal alloy phase observed as an exothermic peak, has at least one melting point observed as an endothermic peak in each of the 210 to 240° C. range and the 300 to 450° C. range, and has no melting point observed as an endothermic peak in the 50 to 209° C. range, and that a bonded object obtained by subjecting the mixture to heat treatment at 246° C. to melt the second metal particles to be bonded to the first metal particles has no melting point observed as an endothermic peak in the 210 to 240° C. range in differential scanning calorimetry or has a melting endotherm calculated from an endothermic peak area in the 210 to 240° C. range, the melting endotherm being 90% or less of the melting endotherm of the mixture calculated from an endothermic peak area in the 210 to 240° C. range.

Specifically, the temperature range of DSC in the present invention is from 30 to 600° C., and a peak having an exotherm or endotherm of ±1.5 J/g or more is quantitatively measured as a peak derived from the object to be measured and a peak smaller than the above is excluded in terms of the accuracy of analysis.

Note that "melting point" as described herein is a temperature at which metal filler particles start to melt and refers to the solidus temperature in DSC.

Illustrated examples of a mixture of first metal particles and second metal particles which is preferred as a conductive filler of the present invention include a mixture of first metal particles having at least one metastable metal alloy phase observed as an exothermic peak in DSC and at least one melting point observed as an endothermic peak in the 300 to 600° C. range and second metal particles having no metastable metal alloy phase observed as an exothermic peak and at least one melting point observed as an endothermic peak in the 210 to 240° C. range. This mixture has at least one metastable metal alloy phase which is derived from the first metal particles and observed as an exothermic peak in DSC and at least one melting point observed as an endothermic peak in the 210 to 240° C. range which is derived from the second metal particles, as well as at least one melting point observed as an endothermic peak in the 300 to 450° C. range which is derived from a new stable metal alloy phase resulting from the reaction of the first metal particles with the second metal particles.

When the above-mentioned mixture undergoes thermal history of the melting point of the second metal particles or higher by subjecting it to heat treatment at 246° C., the second metal particles melt to be bonded to the first metal particles. This accelerates thermal diffusion reaction between the first metal particles and the second metal particles to cause a metastable metal alloy phase to disappear and to form a new stable metal alloy phase. In other words, the presence of a metastable metal alloy phase observed as an exothermic peak in DSC has an effect to promote the progress of the thermal diffusion reaction. The above-mentioned heat treatment temperature may be appropriately set in a peak temperature range of from 240 to 260° C. which is a reflow heat treatment condition for a typical lead-free solder, but it is set at a peak temperature of 246° C. in the present invention.

With the progress of the above-mentioned thermal diffusion reaction, the metal component of the second metal particles having a melting point of from 210 to 240° C. moves to the newly formed stable metal alloy phase having a melting point of from 300 to 450° C. and decreases. Specifically, the melting endotherm after the above-mentioned heat treatment calculated from an endothermic peak area in the 210 to 240° C. range which is derived from the second metal particles is smaller than the melting endotherm before the heat treatment or disappears. At the same time, a new stable metal alloy phase which does not melt at a temperature below 300° C. is formed by the reaction between the first metal particles and the second metal particles.

The DSC endothermic peak area in the 210 to 240° C. range after heat-treating the above-mentioned mixture at 246° C. is preferably from 0 to 90%, more preferably from 0 to 70%, of the endothermic peak area before the heat treatment. When the endothermic peak area is 90% or less, high heat resistance is exhibited by a new stable metal alloy phase which does not melt at a temperature of 300° C. or below. Note that "0%" means that a DSC endothermic peak in the 210 to 240° C. range disappears after the heat treatment.

Therefore, the conductive filler of the present invention can be used as an alternative material of a high temperature solder because when reflow heat treatment temperature for soldering electronic parts to a printed circuit board is less than 300° C., the stable metal alloy phase does not melt completely even by applying repeated thermal history.

Illustrated examples of the first metal particles composing the conductive filler of the present invention include metal particles having at least one metastable metal alloy phase observed as an exothermic peak and at least one melting point observed as an endothermic peak in the 300 to 600° C. range in DSC as mentioned above.

As metal particles exhibiting such thermal properties, there are preferred metal particles comprising a metal alloy having a composition of 50 to 80% by mass of Cu and 20 to 50% by mass of at least one or more elements selected from the group consisting of Ag, Bi, In, and Sn. When the main component of the second metal particles is Sn, it is preferred that the content of Cu in the first metal particles is 50% by mass or more in order to enhance bonding strength by heat treatment. Further, it is preferred that the content of the at least one or more elements selected from the group consisting of Ag, Bi, In, and Sn in the first particles is 20% by mass or more in order to form at least one metastable metal alloy phase and at least one melting point in the 300 to 600° C. range.

Further, it is more preferred that the first metal particles comprise a metal alloy having a composition of 50 to 80% by mass of Cu, 5 to 25% by mass of Sn, 5 to 25% by mass of Ag, 1 to 20% by mass of Bi, and 1 to 10% by mass of In. It is more preferred that the content of Ag and Bi is 5% by mass or more and 1% by mass or more, respectively, in order to facilitate formation of the metastable metal alloy phase. It is more preferred that the content of Sn and In is 5% by mass or more and 1% by mass or more, respectively, in order to promote formation of alloy with the second metal alloy particles at the heat treatment. In addition, it is more preferred that the content of Sn, Ag, Bi, and In is 25% by mass or less, 25% by mass or less, 20% by mass or less, and 10% by mass or less, respectively, in order to bring the content of Cu to 50% by mass or more.

Illustrated examples of the second metal particles include metal particles having no metastable metal alloy phase observed as an exothermic peak and at least one melting point observed as an endothermic peak in the 210 to 240° C. range in DSC as mentioned above.

Metal particles containing Sn in an amount of from 70 to 100% by mass are preferred as metal particles exhibiting such thermal properties. When the main component of the first metal particles is Cu, it is preferred that the content of Sn in the second metal particles is 70% by mass or more in order to enhance bonding strength by heat treatment. In addition, Sn is preferred for forming a melting point in the 210 to 240° C. range in the second metal particles because Sn has a melting point of 232° C. As for components other than Sn, it is preferred that the content of metal elements used in a lead-free solder such as Ag, Al, Bi, Cu, Ge, In, Ni, and Zn is 30% by mass or less.

Further, the second metal particles are more preferably metal particles comprising a metal alloy having the composition of 100% by mass of Sn, or 70 to 99% by mass of Sn and 1 to 30% by mass of at least one or more elements selected from the group consisting of Ag, Bi, Cu, and In.

As for the mixing ratio of the first metal particles to the second metal particles, 100 parts by mass of the first metal particles is mixed with preferably 50 to 200 parts by mass, more preferably 55 to 186 parts by mass, most preferably 80 to 186 parts by mass of the second metal particles. When 100 parts by mass of the first metal particles is mixed with 50 parts by mass or more of the second metal particles, the resulting mixture provides high connection strength at room temperature, and when 100 parts by mass of the first metal particles is mixed with 200 parts by mass or less of the second metal particles, the resulting mixture provides high connection strength at 260° C.

The particle size of the above-mentioned metal particles can be determined according to uses. For example, in a soldering paste use, it is preferred to use particles having an average particle diameter of from 2 to 40 μm and a relatively high sphericity, taking printability into account. Further, in a conductive adhesive use, it is preferred to use irregular-shaped particles in order to increase the contact area of the particles.

Generally, fine metal particles often have oxidized surfaces. Therefore, it is preferred to mix an activator for removing the oxide film and/or to apply pressure in order to promote melting and thermal diffusion by heat treatment in the above-mentioned uses.

As a method for producing first metal particles and second metal particles composing the conductive filler of the present invention, it is desirable to adopt an inert gas atomization method which is a quench solidification method in order to form a metastable metal alloy phase or a stable metal alloy phase in the metal particles. In the gas atomization method, an inert gas such as nitrogen gas, argon gas, and helium gas is typically used. In the present invention, it is preferred to use helium gas, and a quenching rate of from 500 to 5,000° C./sec is preferred.

A soldering paste of the present invention comprises a conductive filler of the present invention and a flux comprising components such as a rosin, a solvent, an activator, and a thickener. The content of the conductive filler in the soldering paste is preferably in the range of from 85 to 95% by mass. The flux is most suitable for the surface treatment of the conductive filler comprising metal particles and promotes melting and thermal diffusion of the metal particles. Known materials such as a flux described in Patent Document 5 can be used as the flux. Further, the addition of an organic amine to the flux as an oxide film remover is more effective. Further, if necessary, a flux whose viscosity is adjusted by adding a solvent to a known flux may be used.

EXAMPLES

Hereinafter, the present invention will be described with reference to Examples.

Metal particles were subjected to differential scanning calorimetry in a nitrogen atmosphere under a condition wherein the temperature of the particles is elevated at a rate of 10° C./min within the temperature range of from 30 to 600° C., using "DSC-50" manufactured by Shimadzu Corporation.

Example 1

(1) Production of First Metal Particles

In a graphite crucible, were placed 6.5 kg of Cu particles (purity: 99% by weight or more), 1.5 kg of Sn particles (purity: 99% by weight or more), 1.0 kg of Ag particles (purity: 99% by weight or more), 0.5 kg of Bi particles (purity: 99% by weight or more), and 0.5 kg of In particles (purity: 99% by weight or more). Using a high frequency induction heater, the mixture in the graphite crucible was heated under an atmosphere of helium gas (purity: 99% by volume or more) so that the temperature of the mixture became 1,400° C., thereby melting the mixture to obtain a molten metal. Next, the molten metal obtained was poured over the brim of the crucible into a spray vessel having an atmosphere of helium gas. From a gas nozzle provided around the brim of the crucible, helium gas (purity: 99% by volume or more; oxygen content: less than 0.1% by volume; pressure: 2.5 MPa) was blown onto the molten metal to gas-atomize the molten metal, thereby producing first metal particles. At this time, the molten metal was cooled at a rate of 2,600° C./sec.

When the first metal particles obtained were observed by means of a scanning electron microscope (S-2700: manufactured by Hitachi Ltd.), they were observed to be spherical. The metal particles were classified by using a current classifier (TC-15N: manufactured by Nisshin Engineering Co., Ltd.) at a setting of 10 μm, followed by collecting the undersize particles. The first metal particles collected had a volume average particle diameter of 2.7 μm. The first metal particles thus obtained were used as a sample for differential scanning calorimetry. As a result, the first metal particles obtained exhibited endothermic peaks at 497° C. and 519° C., and it was confirmed that the particles had a plurality of melting points. In addition, the first metal particles obtained exhibited exothermic peaks at 159° C. and 250° C., and it was confirmed that the particles had a plurality of metastable metal alloy phases.

(2) Production of Second Metal Particles

In a graphite crucible, was placed 10.0 kg of Sn particles (purity: 99% by weight or more). Using a high frequency induction heater, the Sn particles in the graphite crucible was heated under an atmosphere of helium gas (purity: 99% by volume or more) so that the temperature of the Sn particles became 1,400° C., thereby melting the Sn particles to obtain a molten metal. Next, the molten metal obtained was poured over the brim of the crucible into a spray vessel having an atmosphere of helium gas. From a gas nozzle provided around the brim of the crucible, helium gas (purity: 99% by volume or more; oxygen content: less than 0.1% by volume; pressure: 2.5 MPa) was blown onto the molten metal to gas-atomize the molten metal, thereby producing second metal particles. At this time, the molten metal was cooled at a rate of 2,600° C./sec.

When the second metal particles obtained were observed by means of a scanning electron microscope (S-2700: manufactured by Hitachi Ltd.), they were observed to be spherical. The metal particles were classified by using a current classifier (TC-15N: manufactured by Nisshin Engineering Co., Ltd.) at a setting of 10 μm, followed by collecting the undersize particles. The second metal particles collected had a volume average particle diameter of 2.4 μm. The second metal particles thus obtained were used as a sample for differential scanning calorimetry. As a result, the second metal particles obtained exhibited an endothermic peak at 242° C. by the differential scanning calorimetry, and it was confirmed that the particles had a melting point of 232° C. The second metal particles exhibited no characteristic exothermic peak.

(3) Confirmation of the Melting Point Change by Heat Treatment

A conductive filler (average particle diameter: 2.5 μm) obtained by mixing the above-mentioned first metal particles and the above-mentioned second metal particles at a weight ratio of 100:83 was used as a sample for differential scanning calorimetry. The DSC chart obtained by the calorimetry is shown in FIG. 1. As shown in FIG. 1, it was confirmed that the sample exhibited endothermic peaks at 235° C., 350° C., and 374° C. The endothermic peak at 235° C. corresponds to the melting point of 225° C. In addition, the sample characteristically exhibited a specific exothermic peak at 253° C.

Next, a soldering paste was prepared by mixing 91.5% by mass of the above-mentioned conductive filler, 4.25% by mass of a rosin type flux, 1.7% by mass of triethanolamine (oxide film remover), and 2.55% by mass of hexylene glycol (solvent), and treating the mixture with a kneader equipped with a vacuum deaerator (SNB-350: manufactured by Matsuo Sangyo Co., Ltd.), a three roll mill, and a kneader equipped with a vacuum deaerator in succession.

The soldering paste obtained was placed on an aluminum substrate and subjected to reflow heat treatment at a peak temperature of 246° C. in a nitrogen atmosphere. A mesh belt type continuous heat treatment apparatus manufactured by Koyo Thermo System Co., Ltd. was used as a heat treatment apparatus. The conditions of the temperature profile adopted were as follows: the total process is 15 minutes; temperature is raised to 163° C. in 4 minutes from the start of heat treatment; the temperature is then raised gradually until it reaches a peak temperature of 246° C. in 9.5 minutes; and then the temperature is gradually decreased so that it reaches 106° C. at the completion of heat treatment.

The soldering paste after the heat treatment was used as a sample for differential scanning calorimetry. The DSC chart obtained by the calorimetry is shown in FIG. 2. As shown in FIG. 2, it was confirmed that the soldering paste after the heat treatment exhibited endothermic peaks at 350° C. and 370° C.

and the endothermic peak at 235° C. had disappeared. The endothermic peak at 350° C. corresponds to the melting point of 320° C. Thus, it was confirmed that the lowest melting point of the conductive filler rose from 225° C. to 320° C. by reflow heat treatment at a peak temperature of 246° C.

(4) Confirmation of Bonding Strength and Heat Resistance

The above-mentioned soldering paste was printed on a Cu substrate to thereby form a soldering paste having a size of 2 mm×3.5 mm, on which a chip having a size of 2 mm×2 mm was mounted. The resulting Cu substrate with the soldering paste and the chip thereon was subjected to reflow heat treatment at a peak temperature of 246° C. in a nitrogen atmosphere in accordance with the heat treatment method as mentioned above, thereby preparing a sample. In the formation of a printing pattern, "MT-320TV" manufactured by Micro-tec Co., Ltd. was used as a printer, and a screen mask was used as a plate. The screen mask has an aperture of 2 mm×3.5 mm and a thickness of 50 μm. Printing conditions were as follows:

printing speed: 20 mm/sec, printing pressure: 0.1 MPa, squeegee pressure: 0.2 MPa, back pressure: 0.1 MPa, attack angle: 20°, clearance: 1 mm, and the number of printing: once. Further, as the chip, was used a Si chip which has a thickness of 0.6 mm and has a bonding surface with an Au/Ni/Cr (3,000/2,000/500 angstrom) layer formed thereon by sputtering.

Next, the chip was measured for the bonding strength in shearing direction at ordinary temperature (25° C.) by means of a push-pull gage at a pushing speed of 10 mm/min, followed by converting the measured value to a per unit area basis to obtain a bonding strength of 14 MPa. Further, a sample prepared in the same manner as described above was heated on a hot plate up to 260° C. and kept at 260° C. for one minute. The sample in this state was measured for the bonding strength in shearing direction in the same manner as described above, thereby obtaining a value of 3 MPa.

Example 2

The first metal particles and the second metal particles before classification prepared by gas atomization in Example 1 were classified by using a current classifier (TC-15N: manufactured by Nisshin Engineering Co., Ltd.) at a setting of 40 μm, followed by collecting the undersize particles. A conductive filler (average particle diameter: 4.7 μm) obtained by mixing the first metal particles and the second metal particles thus obtained at a weight ratio of 100:83 was used as a sample.

Next, a soldering paste was prepared by mixing 91.5% by mass of the above-mentioned conductive filler, 5.95% by mass of a rosin type flux, 1.7% by mass of triethanolamine (oxide film remover), and 0.85% by mass of hexylene glycol (solvent), and treating the mixture with a kneader equipped with a vacuum deaerator, a three roll mill, and a kneader equipped with a vacuum deaerator in succession.

The above-mentioned soldering paste was printed on a Cu substrate to thereby form a soldering paste having a size of 2 mm×3.5 mm, on which a chip having a size of 2 mm×2 mm was mounted, and the resulting Cu substrate with the soldering paste and the chip thereon was subjected to reflow heat treatment at a peak temperature of 246° C. in a nitrogen atmosphere, in the same conditions as in Example 1, to prepare a sample. The same apparatus as used in Example 1 was used as a heat treatment apparatus. The conditions of the temperature profile adopted were as follows: the total process is 5 minutes; temperature is raised to 145° C. in 1 minute 30 seconds from the start of heat treatment; the temperature is then raised gradually until it reaches a peak temperature of 246° C. in 3 minutes 15 seconds; and then the temperature is gradually decreased so that it reaches 187° C. at the completion of heat treatment.

Next, the sample was measured for the bonding strength of the chip in shearing direction at ordinary temperature in the same manner as in Example 1, followed by converting the measured value to a per unit area basis to obtain a bonding strength of 19 MPa. Further, a sample prepared in the same manner as in Example 1 was heated on a hot plate up to 260° C. and kept at 260° C. for one minute. The sample in this state was measured for the bonding strength in shearing direction, thereby obtaining a bonding strength in shearing direction of 3 MPa.

(5) Confirmation of Resistance to Ion Migration and Insulation Reliability

Next, the above-mentioned soldering paste was used to print a pattern of "interdigital electrodes" in accordance with "JIS Z 3197" on a glass-epoxy substrate. The pattern was cured by subjecting it to reflow heat treatment at a peak temperature of 246° C. in a nitrogen atmosphere in the same manner as described above, thereby preparing a sample having the "interdigital electrodes".

Next, the sample was used to perform migration test in accordance with the method of "JIS Z 3197". Specifically, each sample was introduced into a thermohygrostat in which the temperature and relative humidity were maintained at 85° C. and 85%, respectively. The sample was stored in the thermohygrostat for 1,000 hours while applying a voltage of 50 V to the sample. Then, the state of the "interdigital electrodes" was observed with a magnifying glass. As a result, formation of a dendrite (dendritic metal) was not confirmed on the "interdigital electrodes" of any sample.

Further, the sample was used to perform insulation resistance test in accordance with a method of "JIS Z 3197". Specifically, each sample was first measured for a resistance value. Next, each sample was introduced into a thermohygrostat in which the temperature and relative humidity were maintained at 85° C. and 85%, respectively. The sample was stored in the thermohygrostat for 1,000 hours while applying a voltage of 50 V to the sample, followed by measuring a resistance value of the sample. As a result, the resistance values before and after the test were $2.5 \times 10^{10}$ Ω and $6.6 \times 10^{10}$ Ω, respectively. Both of the resistance values were higher than $1.0 \times 10^{8}$ Ω, and reduction in insulation resistance values was not observed.

(6) Confirmation of Conductivity

Next, the above-mentioned soldering paste was printed on a ceramic substrate with a pair of Ag/Pd electrodes formed thereon so as to connect the electrodes. The resulting ceramic substrate with the connected electrodes thereon was subjected to reflow heat treatment at a peak temperature of 246° C. in a nitrogen atmosphere in accordance with the heat treatment method as mentioned above. In the formation of a printing pattern, "MT-320TV" manufactured by Micro-tec Co., Ltd. was used as a printer, and a screen mask was used as a plate. The screen mask has an aperture of 2 mm×2 mm and a thickness of 50 μm. Printing conditions were as follows: printing speed: 20 mm/sec, printing pressure: 0.1 MPa, squeegee pressure: 0.2 MPa, back pressure: 0.1 MPa, attack angle: 20°, clearance: 1 mm, and the number of printing: once. The resulting printing pattern was measured for the resistance value in accordance with a two-terminal method. In addition, the volume was calculated from the length, width, and thickness of wiring. The volume resistivity of the printing pattern was calculated from the measured value and the calculated value, and it was found to be 2.1×10$^{-4}$ Ω·cm.

Example 3

A conductive filler (average particle diameter: 4.7 μm) obtained by mixing the first metal particles and the second metal particles classified in Example 2 at a weight ratio of 100:55 was used as a sample for differential scanning calorimetry. The DSC chart obtained by the calorimetry is shown in FIG. 3. As shown in FIG. 3, it was confirmed that the sample exhibited endothermic peaks at 230° C. and 351° C. The endothermic peak at 230° C. corresponds to the melting point of 224° C., and the endotherm is 10.6 J/g. In addition, the sample characteristically exhibited exothermic peaks at 253° C. and 300° C.

Next, a soldering paste was prepared by mixing 91.5% by mass of the above-mentioned conductive filler, 4.25% by mass of a rosin type flux, 1.7% by mass of triethanolamine (oxide film remover), and 2.55% by mass of hexylene glycol (solvent), and treating the mixture with a kneader equipped with a vacuum deaerator, a three roll mill, and a kneader equipped with a vacuum deaerator in succession.

The soldering paste obtained was placed on an aluminum substrate and subjected to reflow heat treatment at a peak temperature of 246° C. in a nitrogen atmosphere in accordance with the same heat treatment method as in Example 2. The soldering paste after the heat treatment was used as a sample for differential scanning calorimetry. The DSC chart obtained by the calorimetry is shown in FIG. 4. As shown in FIG. 4, it was confirmed that the soldering paste after the heat treatment exhibited endothermic peaks at 351° C. and 382° C. and the endothermic peak at 230° C. had disappeared. The endothermic peak at 351° C. corresponds to the melting point of 326° C. Thus, it was confirmed that the lowest melting point of the conductive filler rose from 224° C. to 326° C. by reflow heat treatment at a peak temperature of 246° C.

The above-mentioned soldering paste was printed on a Cu substrate in the same conditions as in Example 1 to thereby form a soldering paste having a size of 2 mm×3.5 mm, on which a chip having a size of 2 mm×2 mm was mounted, and the resulting Cu substrate with the soldering paste and the chip thereon was subjected to reflow heat treatment in a nitrogen atmosphere in the same manner as in Example 2 to prepare a sample.

Next, the sample was measured for the bonding strength of the chip in shearing direction at ordinary temperature in the same manner as in Example 1, followed by converting the measured value to a per unit area basis to obtain a bonding strength of 7 MPa. Further, a sample prepared in the same manner as in Example 1 was heated on a hot plate up to 260° C. and kept at 260° C. for one minute. The sample in this state was measured for the bonding strength in shearing direction in the same manner as described above, thereby obtaining a bonding strength in shearing direction of 2 MPa. Thus, it was possible to confirm a heat resistance capable of retaining the bonding strength even at 260° C.

Example 4

The first metal particles before classification prepared by gas atomization in Example 1 were classified by using a current classifier (TC-15N: manufactured by Nisshin Engineering Co., Ltd.) at a setting of 1.6 μm, followed by classifying again the oversize particles at a setting of 10 μm and collecting the resulting undersize particles. Next, the second metal particles before classification prepared by gas atomization in Example 1 were classified by using a current classifier (TC-15N: manufactured by Nisshin Engineering Co., Ltd.) at a setting of 5 μm, followed by classifying again the oversize particles at a setting of 40 μm and collecting the resulting undersize particles. A conductive filler (average particle diameter: 4.3 μm) obtained by mixing the first metal particles and the second metal particles thus obtained at a weight ratio of 100:83 was used as a sample.

Next, a soldering paste was prepared by mixing 90.3% by mass of the above-mentioned conductive filler and 9.7% by mass of a rosin type flux and treating the mixture with a paste kneader (SPS-1: manufactured by Malcom Co., Ltd.) and a kneader equipped with a vacuum deaerator in succession.

The above-mentioned soldering paste was printed on a Cu substrate in the same conditions as in Example 1 to thereby form a soldering paste having a size of 2 mm×3.5 mm, on which a chip having a size of 2 mm×2 mm was mounted, and the resulting Cu substrate with the soldering paste and the chip thereon was subjected to reflow heat treatment in a nitrogen atmosphere in the same manner as in Example 2 to prepare a sample.

Next, the sample was measured for the bonding strength of the chip in shearing direction at ordinary temperature in the same manner as in Example 1, followed by converting the measured value to a per unit area basis to obtain a bonding strength of 12 MPa. Further, a sample prepared in the same manner as in Example 1 was heated on a hot plate up to 260° C. and kept at 260° C. for one minute. The sample in this state was measured for the bonding strength in shearing direction in the same manner as described above, thereby obtaining a bonding strength in shearing direction of 4 MPa. Thus, it was possible to confirm a heat resistance capable of retaining the bonding strength even at 260° C.

Example 5

A conductive filler (average particle diameter: 5.1 μm) obtained by mixing the first metal particles and the second metal particles classified in Example 4 at a weight ratio of 100:186 was used as a sample for differential scanning calorimetry. The DSC chart obtained by the calorimetry is shown in FIG. 5. As shown in FIG. 5, it was confirmed that the sample exhibited endothermic peaks at 235° C. and 406° C. The endothermic peak at 235° C. corresponds to the melting point of 228° C., and the endotherm is 22.3 J/g. In addition, the sample characteristically exhibited an exothermic peak at 256° C.

Next, a soldering paste was prepared by mixing 90.3% by mass of the above-mentioned conductive filler and 9.7% by mass of a rosin type flux and treating the mixture with a paste kneader and a kneader equipped with a vacuum deaerator in succession.

The soldering paste obtained was placed on an aluminum substrate and subjected to reflow heat treatment in a nitrogen atmosphere in the same manner as in Example 2. The soldering paste after the heat treatment was used as a sample for differential scanning calorimetry. The DSC chart obtained by the calorimetry is shown in FIG. 6. As shown in FIG. 6, it was confirmed that the soldering paste after the heat treatment exhibited endothermic peaks at 216° C. and 399° C. The endothermic peak at 216° C. corresponds to the melting point of 206° C., and the endotherm is 14.7 J/g. The endothermic peak at 216° C. is derived from the endothermic peak at 235° C. which corresponds to the lowest melting point of the conductive filler before heat treatment. Thus, it was confirmed that the endotherm at the lowest melting point of the conductive filler decreased from 22.3 J/g to 14.7 J/g, which is about 66% of the original value, by reflow heat treatment at a peak temperature of 246° C.

The above-mentioned soldering paste was printed on a Cu substrate in the same conditions as in Example 1 to thereby form a soldering paste having a size of 2 mm×3.5 mm, on which a chip having a size of 2 mm×2 mm was mounted, and the resulting Cu substrate with the soldering paste and the chip thereon was subjected to reflow heat treatment in a nitrogen atmosphere in the same manner as in Example 2 to prepare a sample.

Next, the sample was measured for the bonding strength of the chip in shearing direction at ordinary temperature in the same manner as in Example 1, followed by converting the measured value to a per unit area basis to obtain a bonding strength of 19 MPa. Further, a sample prepared in the same manner as in Example 1 was heated on a hot plate up to 260° C. and kept at 260° C. for one minute. The sample in this state was measured for the bonding strength in shearing direction in the same manner as described above, thereby obtaining a bonding strength in shearing direction of 0.3 MPa. Thus, it was possible to confirm a heat resistance capable of retaining the bonding strength even at 260° C.

In other words, it was found that the sample in which the soldering paste was subjected to reflow heat treatment had a heat resistance capable of retaining the bonding strength when it was heated to 260° C., even when the melting point remained unchanged below 260° C. This is because when the melting endotherm calculated from the endothermic peak area at the lowest melting point decreases by reflow heat treatment at a peak temperature of 246° C., there is formed a part which does not melt even at 260° C.

Comparative Example 1

A conductive filler (average particle diameter: 6.6 μm) obtained by mixing the first metal particles and the second metal particles classified in Example 4 at a weight ratio of 100:567 was used as a sample for differential scanning calorimetry. The DSC chart obtained by the calorimetry is shown in FIG. 7.

As shown in FIG. 7, it was confirmed that the sample exhibited an endothermic peak at 235° C. The endothermic peak at 235° C. corresponds to the melting point of 228° C., and the endotherm is 31.1 J/g. In addition, the sample characteristically exhibited an exothermic peak at 257° C.

Next, a soldering paste was prepared by mixing 90.3% by mass of the above-mentioned conductive filler and 9.7% by mass of a rosin type flux and treating the mixture with a paste kneader and a kneader equipped with a vacuum deaerator in succession.

The soldering paste obtained was placed on an aluminum substrate and subjected to reflow heat treatment in a nitrogen atmosphere in the same manner as in Example 2. The soldering paste after the heat treatment was used as a sample for differential scanning calorimetry. The DSC chart obtained by the calorimetry is shown in FIG. 8. As shown in FIG. 8, it was confirmed that the soldering paste after the heat treatment exhibited endothermic peaks at 227° C. and 421 ° C. The endothermic peak at 227° C. corresponds to the melting point of 217° C., and the endotherm is 31.2 J/g. The endothermic peak at 227° C. is derived from the endothermic peak at 235° C. which corresponds to the lowest melting point of the conductive filler before heat treatment. However, when these endothermic peaks are compared, the melting endotherm calculated from the endothermic peak area at the lowest melting point is about 100%, and it is considered that the melting endotherm is not changed even taking a DSC measurement accuracy of ±1.5 J/g into account.

The above-mentioned soldering paste was printed on a Cu substrate in the same conditions as in Example 1 to thereby form a soldering paste having a size of 2 mm×3.5 mm, on which a chip having a size of 2 mm×2 mm was mounted, and the resulting Cu substrate with the soldering paste and the chip thereon was subjected to reflow heat treatment in a nitrogen atmosphere in the same manner as in Example 2 to prepare a sample.

Next, the sample was measured for the bonding strength of the chip in shearing direction at ordinary temperature in the same manner as in Example 1, followed by converting the measured value to a per unit area basis to obtain a bonding strength of 12 MPa. Further, a sample prepared in the same manner as in Example 1 was heated on a hot plate up to 260° C. and kept at 260° C. for one minute. In this state, it was attempted to measure the bonding strength in shearing direction in the same manner as described above. However, the soldering paste remelted to lift the chip, and it was impossible to measure the bonding strength.

Comparative Example 2

A soldering paste was prepared by mixing 91.5% by mass of the second metal particles prepared in Example 1, 4.25% by mass of a rosin type flux, 1.7% by mass of triethanolamine (oxide film remover), and 2.55% by mass of hexylene glycol (solvent), and treating the mixture with a kneader equipped with a vacuum deaerator, a three roll mill, and a kneader equipped with a vacuum deaerator in succession.

The above-mentioned soldering paste was printed on a Cu substrate to thereby form a soldering paste having a size of 2 mm×3.5 mm, on which a chip having a size of 2 mm×2 mm was mounted, and the resulting Cu substrate with the soldering paste and the chip thereon was subjected to reflow heat treatment at a peak temperature of 301° C. in a nitrogen atmosphere, in the same conditions as in Example 1, to prepare a sample. The same apparatus as used in Example 1 was used as a heat treatment apparatus. The conditions of the temperature profile adopted were as follows: the total process is 15 minutes; temperature is raised at a constant rate from the start of heat treatment until it reaches a peak temperature of 301° C. in 9.5 minutes; and then the temperature is gradually decreased so that it reaches 126° C. at the completion of heat treatment.

Next, the sample was measured for the bonding strength of the chip in shearing direction at ordinary temperature in the same manner as in Example 1, followed by converting the measured value to a per unit area basis to obtain a bonding strength of 9 MPa. Further, a sample prepared in the same manner as in Example 1 was heated on a hot plate up to 260° C. and kept at 260° C. for one minute. In this state, it was attempted to measure the bonding strength in shearing direction in the same manner as in Example 1. However, the soldering paste remelted to lift the chip, and it was impossible to measure the bonding strength.

Comparative Example 3

Sn-3.0Ag-0.5Cu lead-free solder particles (average particle diameter: 17.4 μm) were used as a sample for differential scanning calorimetry. The DSC chart obtained by the calorimetry is shown in FIG. 9.

As shown in FIG. 9, it was confirmed that the sample exhibited an endothermic peak at 229° C. The endothermic peak at 229° C. corresponds to the melting point of 220° C., and the endotherm was 41.8 J/g.

Next, a soldering paste was prepared by mixing 91.5% by mass of the above-mentioned conductive filler, 5.95% by mass of a rosin type flux, 1.7% by mass of triethanolamine (oxide film remover), and 0.85% by mass of hexylene glycol (solvent), and treating the mixture with a kneader equipped with a vacuum deaerator, a three roll mill, and a kneader equipped with a vacuum deaerator in succession.

The soldering paste obtained was placed on an aluminum substrate and subjected to reflow heat treatment in a nitrogen atmosphere in the same manner as in Example 2. The soldering paste after the heat treatment was used as a sample for differential scanning calorimetry. The DSC chart obtained by the calorimetry is shown in FIG. 10. As shown in FIG. 10, it was confirmed that the soldering paste after the heat treatment exhibited an endothermic peak at 229° C. The endothermic peak at 229° C. corresponds to the melting point of 220° C., and the endotherm was 41.4 J/g. The endothermic peak at 229° C. after the heat treatment is derived from the endothermic peak at 229° C. before the heat treatment. However, when these endothermic peaks are compared, the melting endotherm calculated from the endothermic peak area at the lowest melting point is about 99%, and it is considered that the melting endotherm is not changed even taking a DSC measurement accuracy of ±1.5 J/g into account.

The above-mentioned soldering paste was printed on a Cu substrate in the same conditions as in Example 1 to thereby form a soldering paste having a size of 2 mm×3.5 mm, on which a chip having a size of 2 mm×2 mm was mounted, and the resulting Cu substrate with the soldering paste and the chip thereon was subjected to reflow heat treatment in a nitrogen atmosphere in the same manner as in Example 2 to prepare a sample.

Next, the sample was measured for the bonding strength of the chip in shearing direction at ordinary temperature in the same manner as in Example 1, followed by converting the measured value to a per unit area basis to obtain a bonding strength of 23 MPa. Further, a sample prepared in the same manner as in Example 1 was heated on a hot plate up to 260° C. and kept at 260° C. for one minute. In this state, it was attempted to measure the bonding strength in shearing direction in the same manner as in Example 1. However, the soldering paste remelted to lift the chip, and it was impossible to measure the bonding strength.

As described above, the use of the conductive filler of the present invention enables production of a solder material with high heat resistance which can be melt-bonded under reflow heat treatment conditions (in the peak temperature range of 240 to 260° C.) for a conventional lead-free solder. Further, also as a soldering paste, it was confirmed that the solder material was excellent in resistance to ion migration, insulation reliability, and conductivity.

Industrial Applicability

The conductive filler of the present invention is a lead-free material, and there is expected its application as a solder material with high heat resistance which can be melt-bonded under reflow heat treatment conditions for a conventional lead-free solder.

The invention claimed is:

1. A conductive filler comprising a mixture of first metal particles and second metal particles, characterized in that, as measured by differential scanning calorimetry, the mixture has at least one metastable metal alloy phase observed as an exothermic peak, and has at least one melting point observed as an endothermic peak in each of the 210 to 240° C. range and the 300 to 450° C. range, but has no melting point observed as an endothermic peak in the 50 to 209° C. range, and that a bonded object obtained by subjecting the mixture to heat treatment at 246° C. to melt the second metal particles so as to be bonded to the first metal particles has, as measured by differential scanning calorimetry, no melting point observed as an endothermic peak in the 210 to 240° C. range or has a melting endotherm calculated from an endothermic peak area in the 210 to 240° C. range, the melting endotherm being 90% or less of the melting endotherm of the mixture calculated from an endothermic peak area in the 210 to 240° C. range, wherein as for the mixing ratio of the first metal particles to the second metal particles, 100 parts by mass of the first metal particles is mixed with 80 to 186 parts by mass of the second metal particles, and wherein the first metal particles comprise a metal alloy having a composition of 65 to 80% by mass of Cu and 20 to 35% by mass of at least one or more elements selected from the group consisting of Ag, Bi, In, and Sn, and the second metal particles comprise a metal alloy having a composition of 70 to 100% by mass of Sn.

2. A soldering paste comprising the conductive filler according to claim 1.

* * * * *